(12) United States Patent
Motooka

(10) Patent No.: US 9,864,227 B2
(45) Date of Patent: *Jan. 9, 2018

(54) DISPLAY DEVICE

(71) Applicant: Japan Display Inc., Tokyo (JP)

(72) Inventor: Munenori Motooka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/137,342

(22) Filed: Apr. 25, 2016

(65) Prior Publication Data

US 2016/0238879 A1 Aug. 18, 2016

Related U.S. Application Data

(63) Continuation of application No. 14/177,246, filed on Feb. 11, 2014, now Pat. No. 9,348,168.

(30) Foreign Application Priority Data

Feb. 28, 2013 (JP) .................................. 2013-040073

(51) Int. Cl.
*G02F 1/1345* (2006.01)
*G02F 1/1335* (2006.01)
(Continued)

(52) U.S. Cl.
CPC ...... *G02F 1/133512* (2013.01); *G02F 1/1368* (2013.01); *G02F 1/13452* (2013.01); *H01L 27/124* (2013.01); *H01L 29/78633* (2013.01); *G02F 1/1309* (2013.01); *G02F 1/13338* (2013.01); *G02F 1/133514* (2013.01);
(Continued)

(58) Field of Classification Search
CPC ............. G02F 1/133512; G02F 1/1309; G02F 1/13452; G02F 2001/133388; G02F 1/13338; G02F 1/133514; G02F 1/133528; G02F 1/1368; G02F 127/124; G02F 129/786; H05K 2201/10128; H05K 3/361; H05K 2201/0108; H05K 2201/0112;
(Continued)

(56) References Cited

U.S. PATENT DOCUMENTS

| 5,850,275 A | 12/1998 | Watanabe et al. |
| 6,819,376 B1 | 11/2004 | Muramatsu |
| 2013/0058020 A1* | 3/2013 | Jo .......................... G02F 1/1345 361/679.01 |

FOREIGN PATENT DOCUMENTS

JP 2012-252905 A 12/2012

* cited by examiner

*Primary Examiner* — Charles Chang
(74) *Attorney, Agent, or Firm* — Typha IP LLC

(57) ABSTRACT

A display device includes a first substrate on which a thin film transistor is formed and which is divided into a display area and a non-display area outside thereof, a second substrate arranged to face an upper surface of the first substrate, a light-shielding film provided in an area between the first substrate and the second substrate, and a circuit provided on an upper surface of the second substrate and in an area facing the display area. The second substrate includes a terminal part of the circuit, which is provided on the upper surface of the second substrate and in an area facing the non-display area. The terminal part is connected with a circuit driving substrate, which drives the circuit through an anisotropic conductive film covering the terminal part. The light-shielding film is provided to avoid at least part of an area facing the terminal part.

6 Claims, 7 Drawing Sheets

(51) Int. Cl.
  *G02F 1/1368* (2006.01)
  *H01L 27/12* (2006.01)
  *H01L 29/786* (2006.01)
  G02F 1/13 (2006.01)
  G02F 1/1333 (2006.01)
  H05K 3/36 (2006.01)
  H05K 1/14 (2006.01)

(52) U.S. Cl.
  CPC .......... *G02F 1/133528* (2013.01); *G02F 2001/133388* (2013.01); *H05K 1/147* (2013.01); *H05K 3/361* (2013.01); *H05K 2201/0108* (2013.01); *H05K 2201/0112* (2013.01); *H05K 2201/10128* (2013.01); *H05K 2201/10136* (2013.01)

(58) Field of Classification Search
  CPC .......... H05K 1/147; H05K 2201/10136; H01L 27/124; H01L 29/786
  USPC .......................................................... 349/149
  See application file for complete search history.

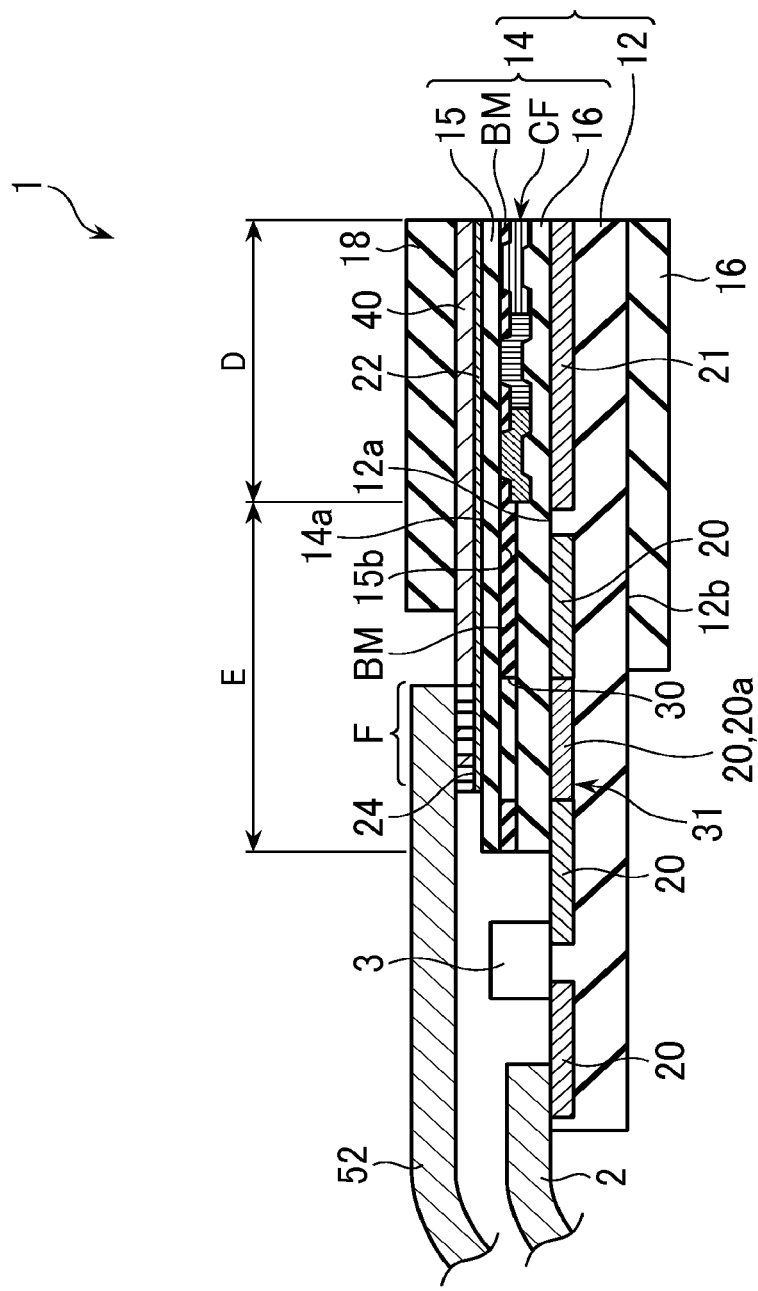

DISPLAY DEVICE

CROSS-REFERENCE TO RELATED APPLICATION

This application is a continuation of U.S. patent application Ser. No. 14/177,246, filed on Feb. 11, 2014. Further, this application claims priority from Japanese application JP 2013-040073 filed on Feb. 28, 2013, the content of which is hereby incorporated by reference into this application.

BACKGROUND OF THE INVENTION

1. Field of the Invention

The present invention relates to a display device.

2. Description of the Related Art

A display device including a pair of substrates is widely used as a display device of a computer, an information communication terminal such as a cellular phone, or the like. As the substrates, a TFT (thin film transistor) substrate on which a thin film transistor is formed, or a color filter substrate including a color filter is used. When a circuit and a terminal are formed on the color filter substrate, a flexible print substrate for driving the circuit is connected to the terminal on the color filter substrate.

As the display device as stated above, for example, JP 2012-252905 A discloses a display device including an EL (Electro-Luminescence) substrate and a color filter substrate which are bonded to each other. The EL substrate includes a display area, and an information display unit is formed in a peripheral area thereof. Besides, a black matrix is formed in a peripheral area of the color filter substrate, and an area which is part of the black matrix and faces the information display unit is removed.

SUMMARY OF THE INVENTION

In the related art display device, the color filter substrate including the color filter is arranged on the TFT substrate divided into a display area displaying an image and a non-display area outside thereof, so that the color filter substrate faces an upper surface of the TFT substrate. Besides, the terminal is provided on an upper surface of the color filter substrate and in an area facing the non-display area. The terminal is connected with the flexible print substrate through, for example, an anisotropic conductive film. Besides, the black matrix is arranged in the non-display area of the color filter substrate or the non-display area of the TFT substrate.

In the structure as stated above, since the black matrix is arranged between a connection portion where the terminal is connected with the flexible print substrate and the lower surface of the TFT substrate, the connection portion can not be visually confirmed from the lower surface of the TFT substrate. Thus, it is difficult to confirm the quality of the display device by visually confirming the connection portion where the terminal is connected with the flexible print substrate.

The invention is made in view of such circumstances, and has an object to realize the improvement of reliability of a display device.

(1) According to an aspect of the invention, a display device includes a first substrate on which a thin film transistor is formed and which is divided into a display area and a non-display area outside thereof, a second substrate arranged to face an upper surface of the first substrate, a light-shielding film provided in an area which is between the first substrate and the second substrate and faces the non-display area, and a circuit provided on an upper surface of the second substrate and in an area facing the display area, the second substrate includes a terminal part of the circuit, which is provided on the upper surface of the second substrate and in an area facing the non-display area, the terminal part is connected with a circuit driving substrate, which drives the circuit, through an anisotropic conductive film covering the terminal part, and the light-shielding film is provided to avoid at least part of an area facing the terminal part.

(2) In the display device of the invention as recited in (1), the light-shielding film may be provided with an opening to avoid the area facing the terminal part.

(3) In the display device of the invention as recited in (2), a wiring may be provided in the non-display area of the first substrate and the wiring may be provided to avoid an area facing the opening.

(4) In the display device of the invention as recited in (2) or (3), the opening may be provided in at least three portions which are, in an extension direction of the area where the terminal part is provided, areas corresponding to both ends of the area where the terminal part is provided and an area corresponding to a middle of both the ends.

(5) In the display device of the invention as recited in (2), a wiring may be provided in an area facing the opening and the wiring provided in the area facing the opening may be translucent.

BRIEF DESCRIPTION OF THE DRAWINGS

FIG. 7 is a schematic sectional view of the display device taken along a cutting line VII-VII in FIG. 6.

DETAILED DESCRIPTION OF THE INVENTION

Figure 1:
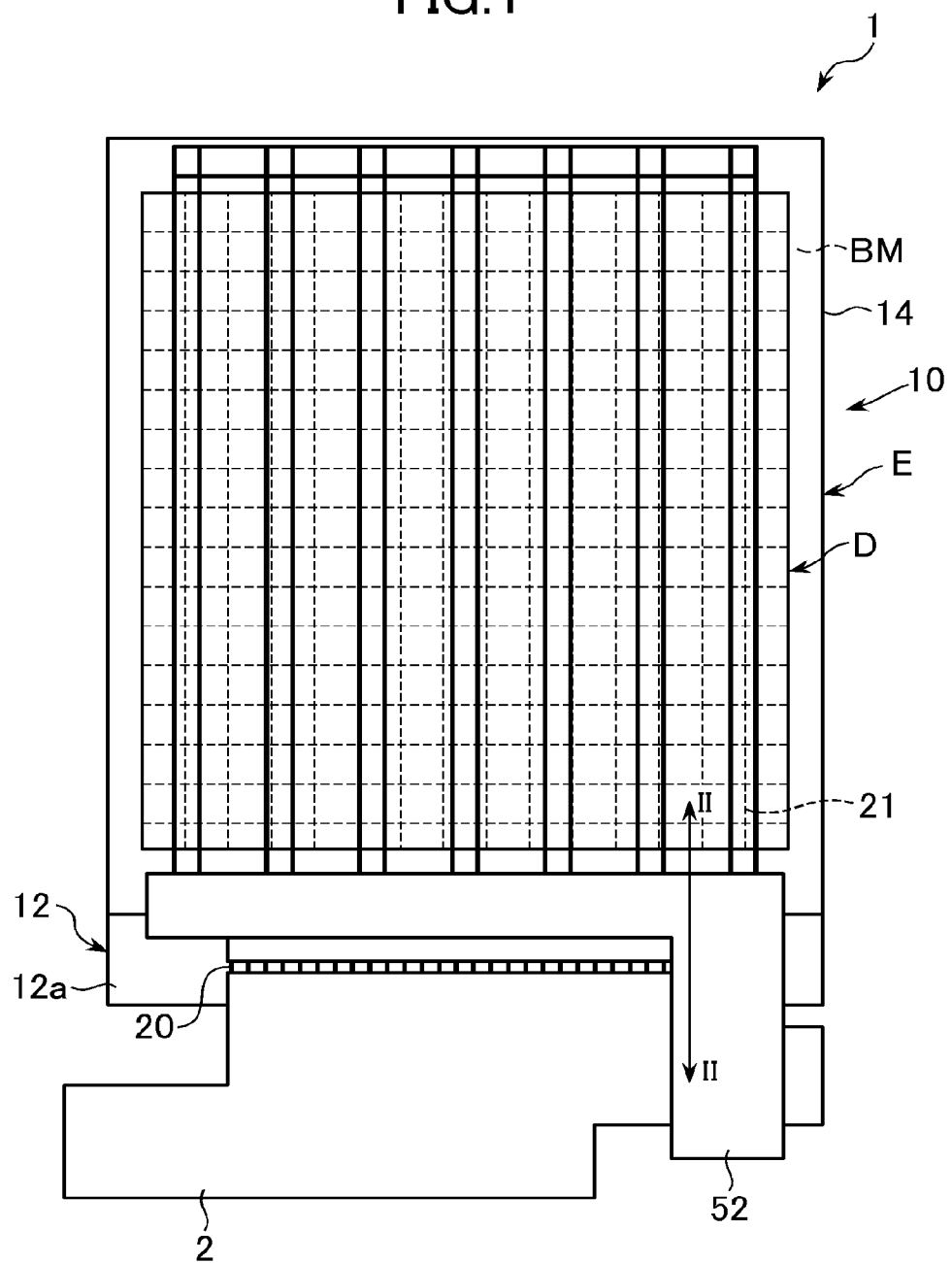
FIG. 1 is a schematic plan view of a display device of a first embodiment.

Hereinafter, a display device of a first embodiment will be described with reference to the drawings while a display device 1 is used as an example. Incidentally, in the drawings referred to in the following description, there is a case where a feature portion is enlarged and shown for convenience to facilitate understanding of the feature, and the size ratio of respective components is not necessarily equal to actual one. Besides, a material and the like exemplified in the following description are merely examples, and the respective components may be different from those, and can can be modified and carried out within the range not changing the gist.

Figure 2:
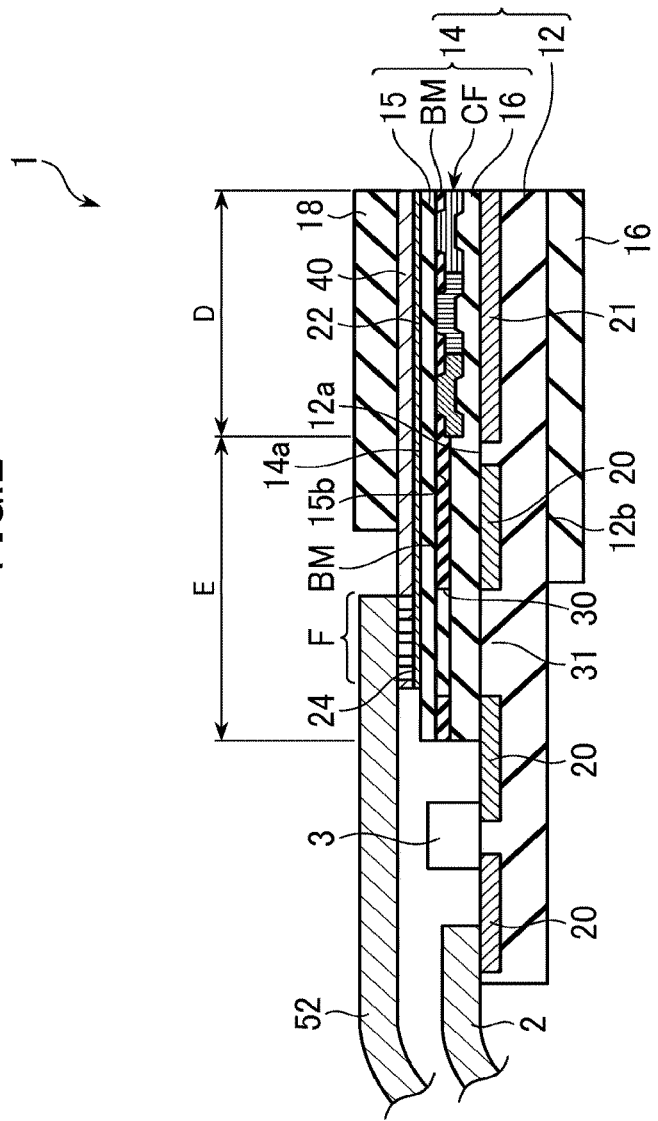
FIG. 2 is a schematic sectional view of the display device taken along a cutting line II-II in FIG. 1.

FIG. 1 is a schematic plan view of the display device 1 of the invention, and FIG. 2 is a schematic sectional view of the display device taken along a cutting line II-II in FIG. 1. The display device 1 includes a liquid crystal display panel 10.

The liquid crystal display panel 10 includes a first substrate 12 and a second substrate 14 arranged on the first substrate 12.

The first substrate 12 is a substrate on which a not-shown thin film transistor is formed and which is divided into a display area D and a non-display area E outside thereof. The second substrate 14 is arranged on an upper surface 12a of the first substrate 12 through a not-shown liquid crystal. Specifically, the first substrate 12 includes the thin film transistor formed on a translucent insulating substrate.

Besides, as shown in FIG. 1 and FIG. 2, for example, a first circuit 21 connected to the thin film transistor is formed on the upper surface 12a of the first substrate 12 in the display area D, and a wiring 20 is formed in the non-display area E of the upper surface 12a of the first substrate 12. The wiring 20 is formed to connect the first circuit 21 and a first flexible wiring substrate 2 described later. The wiring 20 is made of a metal material such as Ag. Incidentally, the detailed structure of the wiring 20 will be described later for convenience of description.

A first polarizing plate 16 is bonded to a lower surface 12b of the first substrate 12 through a not-shown adhesive. Besides, an after-mentioned second polarizing plate 18 is bonded to an upper surface 14a of the second substrate 14 through a not-shown adhesive. Incidentally, in FIG. 1, for convenience of description, the illustration of the first polarizing plate 16 and the second polarizing plate 18 is omitted.

As shown in FIGS. 1 and 2, the first flexible circuit substrate 2 is connected to an area of the upper surface 12a of the first substrate 12 where the second substrate 14 is not arranged, and further, a driver IC (Integrated Circuit) 3 is provided therein. The driver IC 3 is an IC which is arranged on the first substrate 12 and to which image data is supplied from the outside of the display device 1 through the flexible circuit board 2.

The second substrate 14 is, for example, a color filter substrate including a color filter CF. The color filter substrate is used as the second substrate 14, so that the display device 1 can perform color display. Besides, the second substrate 14 of this embodiment may function as a touch panel. Besides, a not-shown touch panel may be arranged on the second substrate 14. The second substrate 14 is arranged to face the upper surface 12a of the first substrate 12 through the not-shown liquid crystal for controlling the passage and interception of light between the first substrate 12 and the second substrate 14.

Specifically, the second substrate 14 includes, for example, a translucent insulating base substrate 15, a light-shielding film BM such as, for example, a black matrix formed on a lower surface 15b of the base substrate 15 and in an area corresponding to the non-display area E, the color filter CF formed in the display area D, and a protecting film 16 covering a lower part of the color filter CF.

Incidentally, in this embodiment, although the example is described in which the light-shielding film BM is formed on the lower surface 15b of the base substrate 15, the light-shielding film BM may be formed at any portion between the first substrate 12 and the second substrate 14 as long as the light-shielding film is formed in the area facing the non-display area E.

A second circuit 22 is formed on the upper surface 14a of the second substrate 14 and in an area facing the display area D, The second circuit 22 is a circuit constituting, for example, a not-shown touch panel. Besides, a terminal part 24 of the second circuit 22 is formed on the upper surface 14a of the second substrate 14 and in an area facing the non-display area E. The terminal part 24 is a terminal for connecting the second circuit 22 and a second flexible wiring substrate 52 as a circuit driving substrate.

The second flexible wiring substrate 52 is the substrate for driving the second circuit 22, and is connected to the terminal part 24 through an anisotropic conductive film 40 covering the terminal part 24. Incidentally, an area where the anisotropic conductive film 40 and the terminal part 24 are connected is a connection area F, and hereinafter, the details of the structure of the first substrate 12 and the second substrate 14 in the connection area F will be described.

Figure 3:
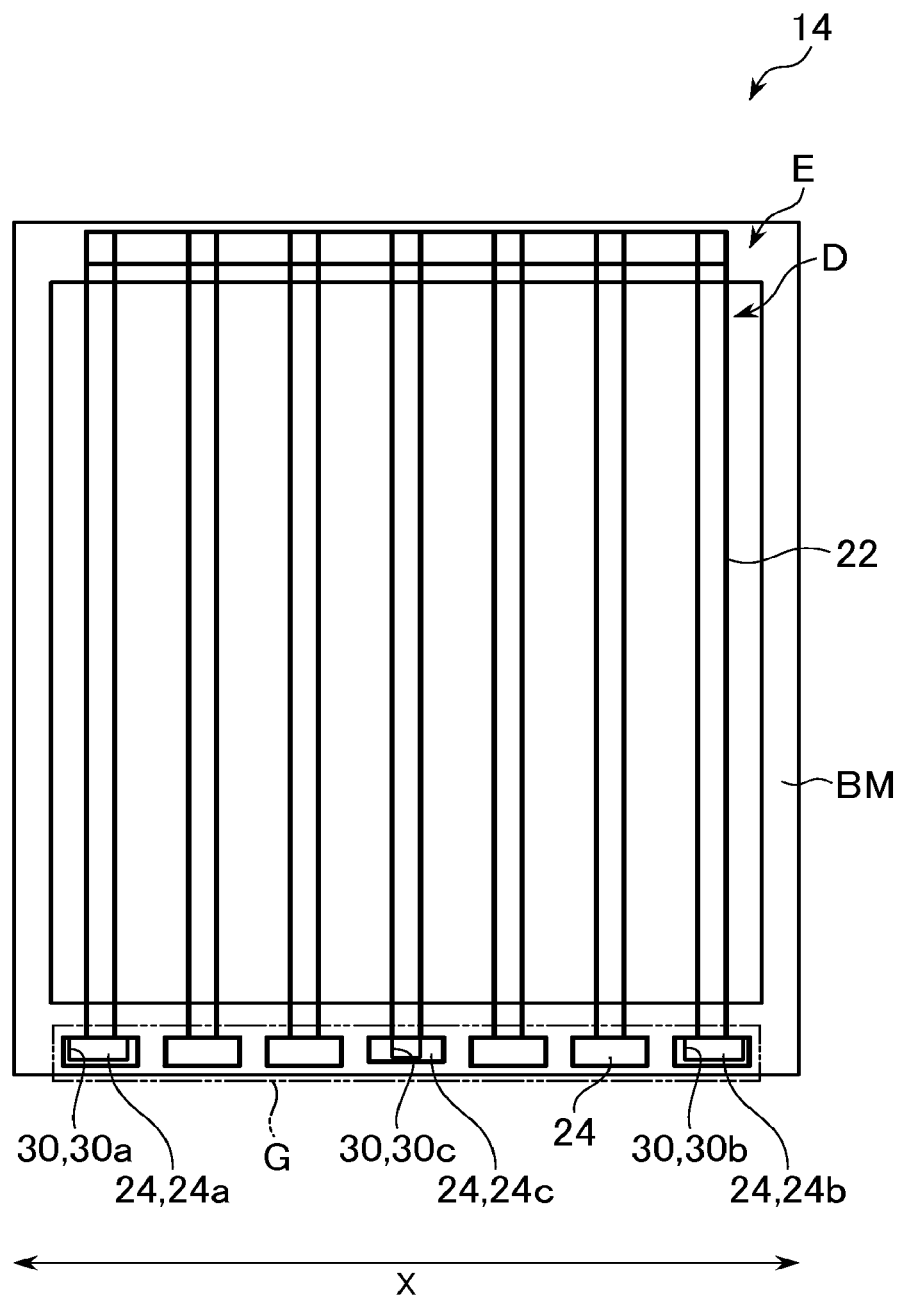
FIG. 3 is a schematic sectional view of a second substrate of the display device shown in FIG. 1.

FIG. 3 is a schematic plan view of the second substrate 14 of the display device 1 shown in FIG. 1. As shown in FIG. 2 and FIG. 3, the light-shielding film BM is provided with an opening 30 for avoiding at least part of am area facing the terminal part 24. The opening 30 is an area where the light-shielding film BM is not formed in order to enable the connection area F to be visually confirmed from the lower surface 12b of the first substrate 12. Incidentally, a translucent insulating material may be filled in the opening 30.

As shown in FIG. 3, when an area where the terminal part 24 is formed is a terminal part forming area G, it is preferable that at least three openings 30 are formed at equal intervals in an extension direction X of the terminal part forming area G. Specifically, when the terminal parts 24 formed in areas corresponding to both ends of the terminal part forming area G are terminal parts 24a and 24b, and the terminal part 24 positioned at the middle between the terminal part 24a and the terminal part 24b is a terminal part 24c, the openings 30 are preferably provided in at least the areas corresponding to the terminal parts 24a, 24b and 24c.

Besides, the shapes of the openings 30 in planar view and the number thereof are not limited to those of the example shown in FIG. 3, find another structure may be adopted as long as at least part of the area facing the terminal part 24 is avoided. Specifically, for example, no limitation is made to the shape as shown in FIG. 3, and a cutout shape may be formed. Besides, at least part of the area facing the terminal part 24 may be avoided by shortening the width of the area where the light-shielding film BM is formed.

Figure 4:
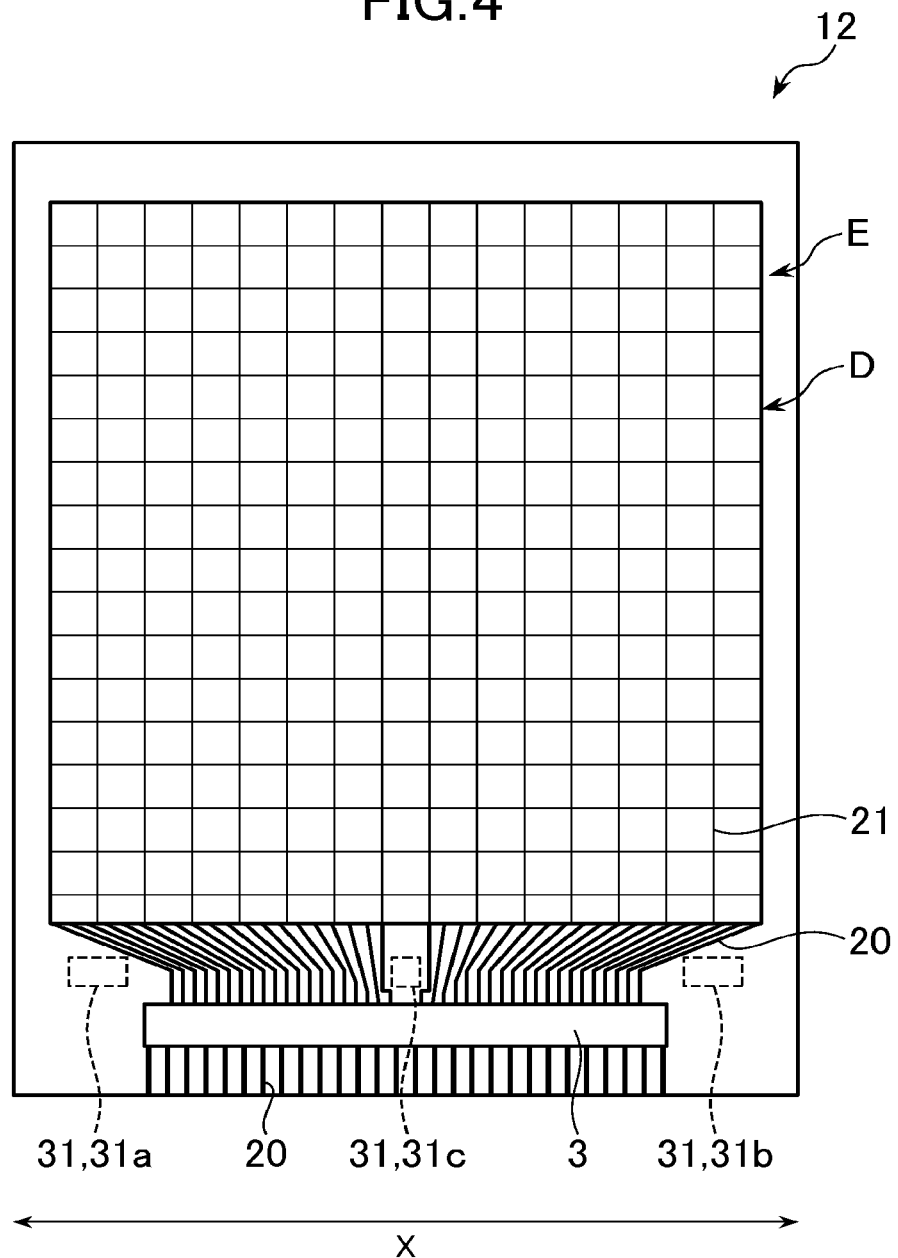
FIG. 4 is a schematic sectional view of a first substrate of the display device shown in FIG. 1.

FIG. 4 is a schematic plan view of the first substrate 12 of the display device 1 shown in FIG. 1. As shown in FIG. 2 and FIG. 4, the wiring 20 is formed from the first circuit 21 formed in the display area D toward the driver IC 3. A plurality of the wirings 20 are formed with intervals in the X direction.

The wirings 20 of this embodiment are formed to avoid at least part of the area 31 facing the opening 30 of the second substrate 14 described before. Specifically, for example, as shown in FIG. 3, when the three openings 30 (the openings 30a, 30b and 30c) are formed with intervals in the extension direction X, as shown in FIG. 4, the wirings 20 are formed to avoid three regions 31a, 31b and 31c facing the openings 30a, 30b and 30c shown in FIG. 3.

Figure 5:
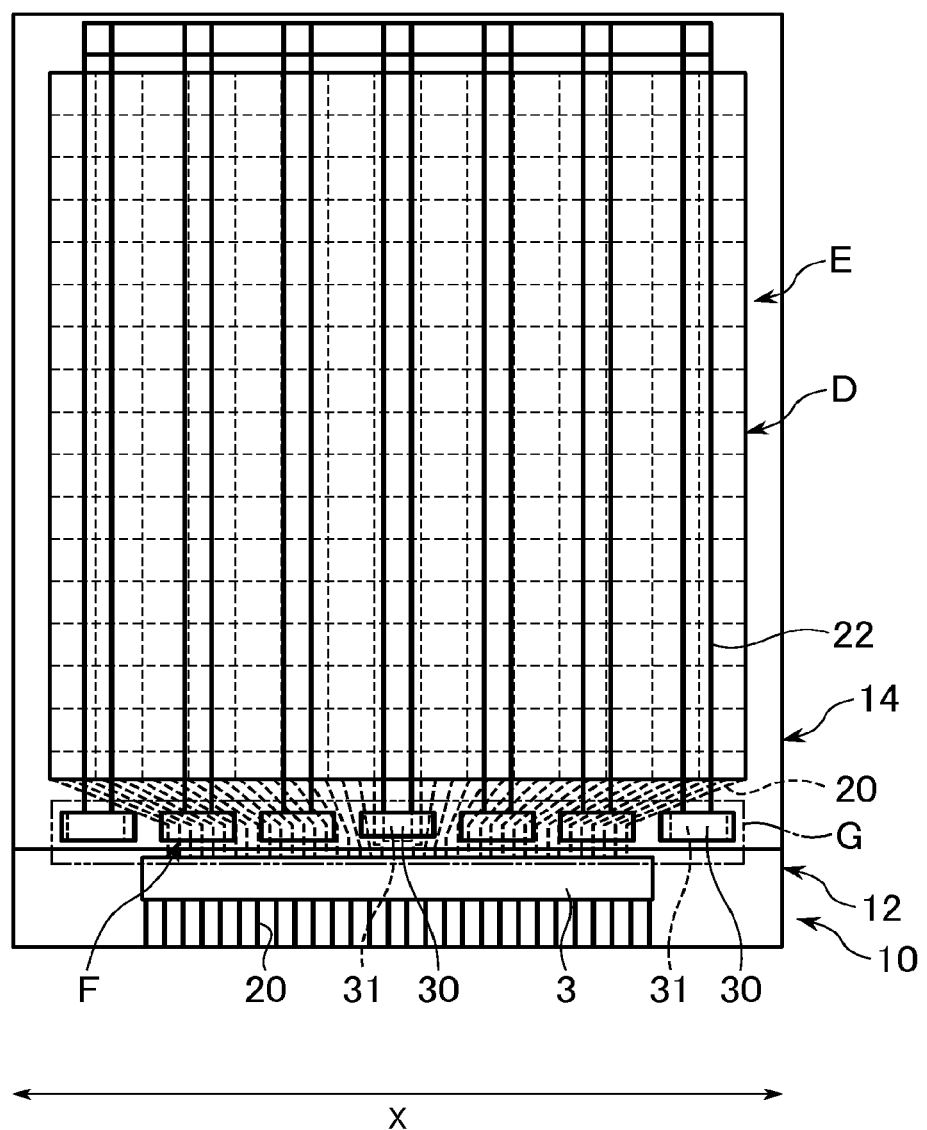
FIG. 5 is a schematic sectional view showing a state where the second substrate shown in FIG. 4 is arranged on the first substrate shown in FIG. 3.

FIG. 5 is a schematic plan view showing a state where the second substrate 14 shown in FIG. 3 is arranged on the first substrate 12 shown in FIG. 4. In the display device 1 of this embodiment, the wirings 20 in the non-display area E of the first substrate 12 are formed to avoid the areas 31 facing the openings 30 of the light-shielding film BM of the second substrate. Thus, as shown in FIG. 2 and FIG. 5, at least part of the area 31 overlaps the inside area of the opening 30.

In the display device 1 of this embodiment, the light-shielding film BM is formed to avoid at least part of the connection area F as the area facing the terminal part 24. Thus, in the area between the lower surface 12b of the first substrate 12 and the upper surface 14a of the second substrate 14, the portion facing the connection area F is translucent. Thus, the connection between the terminal part 24 and the second flexible wiring substrate 52 through the anisotropic conductive film 40 can be visually confirmed from the lower surface 12b side of the first substrate 12. By this, quality control of the display device 1 through visual confirmation of the connection area F is enabled, and the improvement of reliability of the display device 1 can be realized.

Besides, in the display device 1 of this embodiment, since the openings 30 are formed in the light-shielding film BM, formation of the light-shielding film BM in an arbitrary portion (portion where the opening 30 is formed) of the connection area F can be avoided. Thus, an arbitrary portion of the connection portion between the terminal part 24 and the second flexible wiring substrate 52 can be visually confirmed.

Besides, in the display device 1 of this embodiment, the wiring 20 is formed to avoid at least part of the area 31 facing the opening 30 of the second substrate 14. Thus, as compared with a display device without this structure, the connection portion between the terminal part 24 and the second flexible wiring board 52 can be more easily visually confirmed. Thus, the quality control of the display device 1 is facilitated.

Besides, in the display device 1 of this embodiment, the openings 30 (30a, 30b, 30c) are provided in at least the three portions, that is, in the areas corresponding to both ends of the terminal part forming area G and the area corresponding to the middle of both the ends. Thus, as compared with a display device without this structure, the connection state of the terminal part 24 and the second flexible wiring substrate 52 in the whole terminal part forming area G can be confirmed. Thus, the quality control of the display device 1 is enabled, and the improvement of reliability of the display device 1 can be realized.

Next, a display device 1 of a second embodiment will be described. The display device 1 of the second embodiment is different from the display device 1 of the first embodiment in that, a wiring 20 is formed in an area 31 facing an opening 30, and the wiring 20 in the area 31 is translucent. Thus, hereinafter, the structure of the wiring 20 will be described, and the description of the same components as those of the display device 1 of the first embodiment is omitted.

Figure 6:
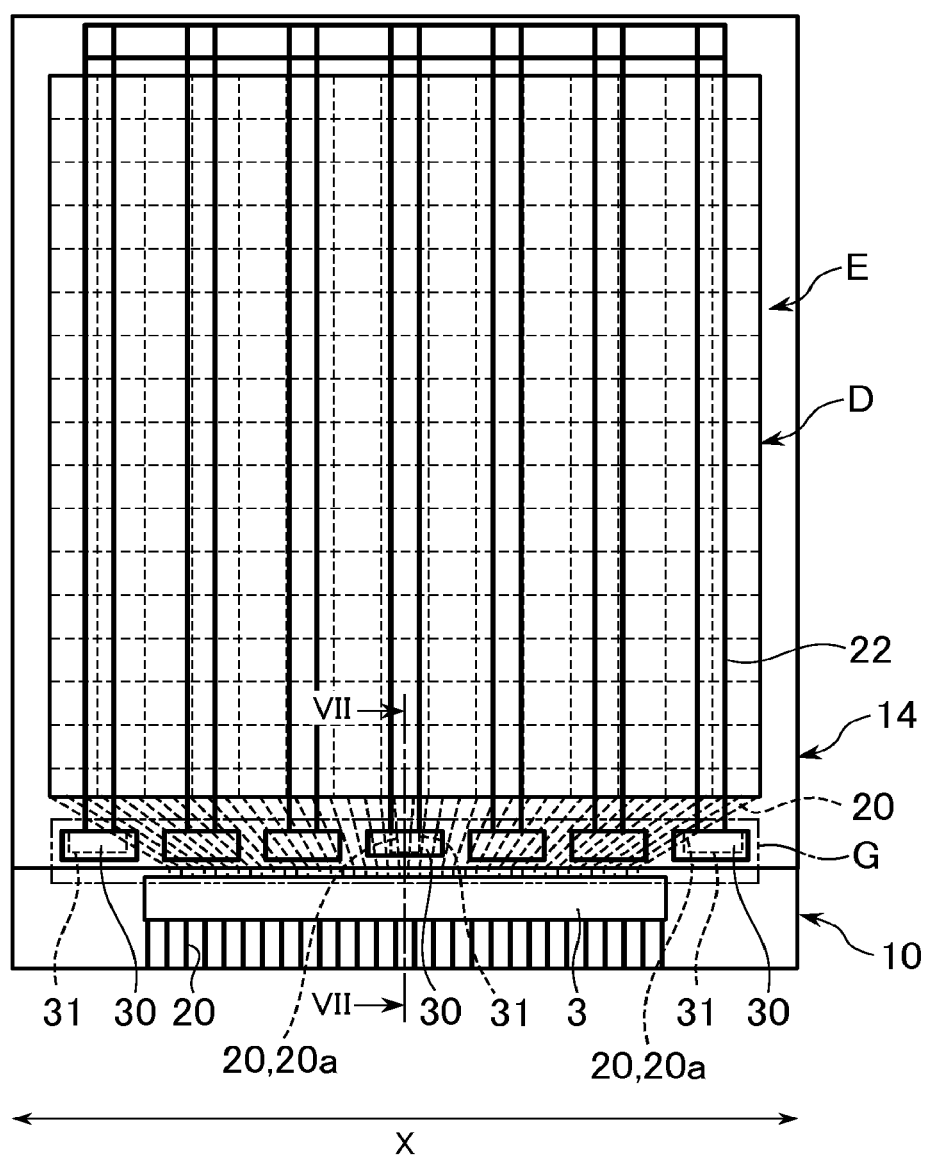
FIG. 6 is a schematic sectional view showing a display device of a second embodiment.

FIG. 6 is a schematic sectional view showing the display device 1 of the second embodiment, and FIG. 7 is a schematic sectional view of the display device 1 taken along a cutting line VII-VII in FIG. 6. The wiring 20 of this embodiment is formed in the area 31 facing the opening 30 of the light-shielding film BM. In the wiring 20, a portion formed in the area 31 is a transparent wiring 20a. The transparent wiring 20a is formed in order to enable a connection area F to be visually confirmed from a lower surface 12b of a first substrate 12.

Although the transparent wiring 20a is made of, for example, ITO, the material is not limited as long as the material is translucent. Besides, as long as the transparent wiring 20a is translucent, the structure of the wiring 20 formed in an area other than the area 31 is not limited. For example, a structure may be such that the whole wiring 20 is translucent, or a structure may be such that the transparent wiring 20a having translucency is connected to the wiring 20 made of metal.

In the display device 1 of this embodiment, since the wiring (transparent wiring 20a) formed in the area 31 is translucent, the portion, which faces the connection area F, between the lower surface 12b of the first substrate 12 and the upper surface 14a of the second substrate 14 is translucent. Thus, the connection between the terminal part 24 and the second flexible wiring substrate 52 can be confirmed from the lower surface 12b side of the first substrate 12. By this, as compared with a display device without this structure, the quality control of the display device 1 through visual confirmation of the connection portion between the terminal part 24 and the second flexible wiring substrate 52 is enabled without reducing the area where the wiring 20 is formed. Thus, the improvement of reliability of the display device 1 and the increase of luminance can be realized.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a first substrate on which a thin film transistor is formed and which is divided into a display area and a non-display area outside thereof;
   a second substrate arranged to face an upper surface of the first substrate;
   a light-shielding film provided in an area which is between the first substrate and the second substrate and faces over the display area to be extended over the non-display area; and
   a wiring provided on an upper surface, which is opposite to the first substrate, of the second substrate and in an area facing the display area, wherein
   the second substrate includes a terminal part of the wiring, which is provided on the upper surface of the second substrate and in an area facing the non-display area,
   the terminal part is connected with a wiring substrate, through an anisotropic conductive film covering the terminal part, and
   the light-shielding film is provided to avoid at least part of an area facing the terminal part.

2. The display device according to claim 1, wherein the light-shielding film is provided with an opening to avoid the area facing the terminal part.

3. The display device according to claim 2, wherein
   another wiring is provided in the non-display area of the first substrate and
   the wiring sitting in the non-display area of the first substrate is provided to avoid an area facing the opening.

4. The display device according to claim 3, wherein the opening is provided in at least three portions which are, in an extension direction of the area where the terminal part is provided, areas corresponding to both ends of the area where the terminal part is provided and an area corresponding to a middle of both the ends.

5. The display device according to claim 2, wherein the opening is provided in at least three portions which are, in an extension direction of the area where the terminal part is provided, areas corresponding to both ends of the area where the terminal part is provided and an area corresponding to a middle of both the ends.

6. The display device according to claim 2, wherein
   another wiring is provided in an area facing the opening and
   the wiring provided in the area facing the opening is translucent.

* * * * *